United States Patent
Hirunuma et al.

(10) Patent No.: US 7,436,443 B2
(45) Date of Patent: Oct. 14, 2008

(54) MOUNTING PLATE FOR SOLID-STATE IMAGING DEVICE AND METHOD FOR BONDING SOLID-STATE IMAGING DEVICE TO MOUNTING PLATE

(75) Inventors: Ken Hirunuma, Tokyo (JP); Keiichi Hotta, Tokyo (JP); Gouji Funatsu, Saitama (JP)

(73) Assignee: Hoya Corporation, Tokyo (JP)

( * ) Notice: Subject to any disclaimer, the term of this patent is extended or adjusted under 35 U.S.C. 154(b) by 813 days.

(21) Appl. No.: 10/373,070

(22) Filed: Feb. 26, 2003

(65) Prior Publication Data
US 2003/0197786 A1   Oct. 23, 2003

(30) Foreign Application Priority Data
Feb. 27, 2002   (JP)   ............... P2002-051096

(51) Int. Cl.
*H04N 3/14* (2006.01)
*H04N 5/225* (2006.01)

(52) U.S. Cl. ............... 348/294; 348/207.99; 358/482; 250/208.1; 257/433

(58) Field of Classification Search .......... 348/294, 348/207.99
See application file for complete search history.

(56) References Cited

U.S. PATENT DOCUMENTS

| 4,594,613 A | 6/1986 | Shinbori et al. |
| 5,614,763 A * | 3/1997 | Womack ............... 257/747 |
| 5,731,834 A | 3/1998 | Huot et al. |
| 5,739,853 A * | 4/1998 | Takahashi ............. 348/335 |
| 5,861,654 A * | 1/1999 | Johnson ............... 257/433 |
| 5,870,638 A | 2/1999 | Kurosawa |
| 5,883,386 A * | 3/1999 | Tsuyuki et al. ......... 250/239 |
| 5,952,714 A * | 9/1999 | Sano et al. ............ 257/680 |
| 6,035,147 A | 3/2000 | Kurosawa |
| 6,040,612 A * | 3/2000 | Minami et al. ......... 257/432 |
| 6,433,328 B1 * | 8/2002 | Chang ................ 250/216 |
| 6,646,316 B2 * | 11/2003 | Wu et al. ............. 257/434 |
| 6,654,064 B2 * | 11/2003 | Ishikawa ............. 348/374 |
| 6,784,409 B2 * | 8/2004 | Kitani ............... 250/208.1 |
| 6,956,610 B1 * | 10/2005 | Walls ................ 348/340 |
| 6,956,615 B2 * | 10/2005 | Nakagishi et al. ...... 348/374 |
| 2001/0010562 A1 | 8/2001 | Nakagishi et al. |

* cited by examiner

*Primary Examiner*—Lin Ye
*Assistant Examiner*—Hung H Lam
(74) *Attorney, Agent, or Firm*—Greenblum & Bernstein, P.L.C.

(57) ABSTRACT

A mounting plate has an opening provided for bonding a solid-state imaging device thereto. The opening of the mounting plate comprises a first edge portion and a second edge portion. The first edge portion corresponds to a first side of part of the contour of a light receiving area of the solid-state imaging device. The second edge portion corresponds to a second side of part of the contour. The first and second edge portions function as reference lines for positioning the solid-state imaging device over said opening.

20 Claims, 10 Drawing Sheets

MOUNTING PLATE FOR SOLID-STATE IMAGING DEVICE AND METHOD FOR BONDING SOLID-STATE IMAGING DEVICE TO MOUNTING PLATE

BACKGROUND OF THE INVENTION

1. Field of the Invention

The present invention relates to a mounting plate to which a solid-state imaging device is attached, and a method for bonding the solid-state imaging device to the mounting plate.

2. Description of the Related Art

As is well known, a solid-state imaging device such as a CCD is used in a digital camera or a video camera. The solid-state imaging device is available as an electronic package, which is not usually directly mounted in the digital camera or video camera. This is because the solid-state imaging device needs to be placed at a proper position relative to a photographing optical system of the digital camera or video camera, and it is difficult to hold the solid-state imaging device at the proper position by itself (i.e., as a single body).

Therefore, conventionally, the solid-state imaging device is fixed on a mounting plate with an adhesive agent, and the mounting plate is then attached to an inner frame provided inside the digital camera or video camera, with a screw. The digital camera or video camera is usually designed in such a manner that, when the mounting plate to which the solid-state imaging device is bonded, is fixed with a screw, the solid-state imaging device is positioned at a proper position relative to the photographing optical system. Accordingly, the positioning accuracy of the solid-state imaging device with respect to the photographing optical system depends upon how exact the solid-state imaging device is bonded in position on the mounting plate.

Conventionally, an opening having an appropriate shape, such as a circle, is formed in a mounting plate, and a positioning mark for positioning the solid-state imaging device is formed on a bonding surface to which the solid-state imaging device is bonded. The solid-state imaging device is placed on the bonding surface in such a manner that a rear surface of the solid-state imaging device closes the opening, and the solid-state imaging device package is then positioned according to the positioning mark on the mounting plate. After that, an appropriate adhesive agent is supplied to the opening, and dried so that the solid-state imaging device is fixed on the mounting plate.

When positioning a solid-state imaging device with respect to the photographing optical system of a digital camera or video camera, the light receiving area of the solid-state imaging device should be positioned in a proper position relative to the photographing optical system. However, the position of the light receiving area relative to a solid-state imaging device package is not uniform, but may be slightly different even in a device manufactured with the identical standards. Therefore, conventionally, even if the solid-state imaging device package is positioned according to the positioning mark, and bonded on the mounting plate, the light receiving area is not necessarily positioned correctly.

Thus, conventionally, when a mount plate, on which a solid-state imaging device is bonded, is fixed with a screw to an inner frame provided inside a digital camera or video camera, it is necessary to finely adjust the screwed position of the mounting plate within the range of play available between the hole of the mounting plate and the stem of the screw. Due to this, the operation of screwing the mounting plate to the inner frame inside the digital camera or video camera takes time, which makes the assembly cost of the digital camera or video camera expensive.

Further, in a conventional mounting plate, the shape of the opening is simple, such as circular, and when an adhesive agent is supplied to a simple-shaped opening to bond the solid-state imaging device to the mounting plate, the bonding takes place at the periphery of the circular opening, so that sufficient bonding strength cannot be obtained.

SUMMARY OF THE INVENTION

Therefore, an object of the present invention is to provide a mounting plate in which the shape of the opening for bonding the solid-state imaging device is improved such that the light receiving area of the solid-state imaging device is properly positioned when the solid-state imaging device is bonded on the mounting plate.

According to the present invention, there is provided a mounting plate having an opening provided for bonding a solid-state imaging device thereto, the solid-state imaging device having a light receiving area. The mounting plate comprises a first edge portion and a second edge portion. The first edge portion defines a first part of the periphery of the opening. The second edge portion defines a second part of the periphery of the opening. The first and second edge portions extend along a contour of the light receiving area to function as reference lines for positioning the solid-state imaging device over the opening.

The mounting plate may further comprise a third edge portion that defines a third part of the periphery of the opening. The third edge portion is formed in such a manner that a bonding periphery of the mounting plate to the solid-state imaging device is increased. Due to this, the strength of the bonding between the solid-state imaging device and the mounting plate is increased.

The first and second edge portions may be straight, and the third edge portion may be curved.

The first edge portion may be perpendicular to the second edge portion.

Another object of the present invention is to provide a mounting method by which the solid-state imaging device is bonded at a proper position on the mounting plate.

According to the present invention, there is provided a method for bonding a solid-state imaging device, having a light receiving area, to a mounting plate that comprises a first edge portion and a second edge portion, the first and second edge portions defining a periphery of an opening, the first and second edge portions corresponding to a contour of the light receiving area so as to function as reference lines for positioning the solid-state imaging device over the opening. The method comprises providing a sub-mounting plate having the same structure as that of the mounting plate, sandwiching the solid-state imaging device between the mounting plate and the sub-mounting plate which are aligned with each other, positioning the solid-state imaging device over the opening by adjusting the reference line of the sub-mounting plate to align with the contour of the light receiving area, while keeping the mounting plate and the sub-mounting plate aligned with each other, and supplying adhesive agent to the periphery of the opening of the mounting plate, so that the solid-state imaging device is attached to the mounting plate.

BRIEF DESCRIPTION OF THE DRAWINGS

The objects and advantages of the present invention will be better understood from the following description, with reference to the accompanying drawings in which.

DESCRIPTION OF THE PREFERRED EMBODIMENTS

Figure 1:
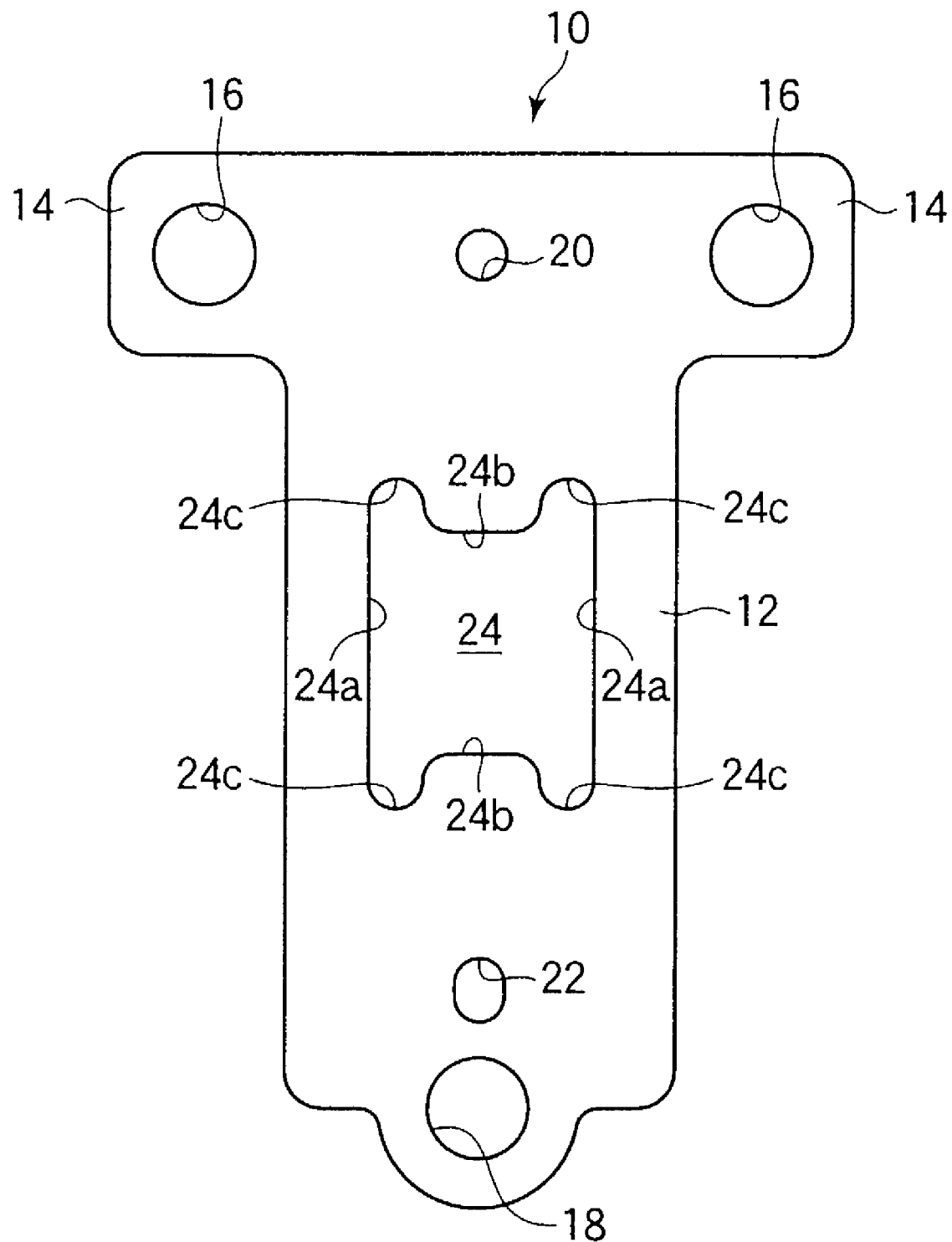
FIG. 1 is a plan view of a mounting plate of an embodiment of the present invention.

The present invention will be described below with reference to the embodiments shown in the drawings.

FIG. 1 shows a plan view of a mounting plate 10 of an embodiment of the present invention. The mounting plate 10 has a rectangular portion 12 and a pair of expanded portions 14 which are provided on an end portion of the rectangular portion 12 and project outward in opposite directions. Namely, the mounting plate 10 has approximately a T-shape as a whole, and can be punched out of a metal plate such as aluminum with a high accuracy.

A pair of through holes 16 are formed in the expanded portions 14, and a through hole 18 is formed in another end portion of the rectangular portion 12. These through holes 16 and 18 are arranged in such a manner that the centers of the holes 16 and 18 coincide with the vertexes of an isosceles triangle. On the other hand, on an attaching portion of an inner frame housed inside a digital camera or video camera, three screw holes are formed and arranged in the same manner as the through holes 16 and 18. By inserting screws into the through holes 16 and 18 and threading the screws in the screw holes, the mounting plate 10 is attached or fixed to the inner frame.

A small hole 20 is formed halfway between the pair of through holes 16 at one end portion of the rectangular portion 12, and a slot 22 is formed adjacent to the hole 18 at the other end portion of the rectangular portion 12. The small hole 20 and the slot 22 function as positioning holes when assembling the mounting plate 10 to an inner frame of a digital camera or video camera. The positioning holes 20 and 22 are formed with the same accuracy as those of the through holes 16 and 18. On the other hand, two positioning projections, which can be fit in the positioning holes 20 and 22, are provided on portions of the inner frame to which the mounting plate 10 is attached. The assembling operation of the mounting plate 10 is performed while the positioning projections are fit in the positioning holes 20 and 22, and therefore, the mounting plate 10 is attached at the proper position regardless of the play between the through holes 16 and 18 and the stems of the screws.

An H-shaped opening 24 is formed in the center portion of the rectangular portion 12, which functions as an adhesive agent holding portion when a solid-state imaging device such as a CCD is adhered to the mounting plate 10 with an adhesive agent, as described later.

A periphery of the opening 24 has first, second, and third parts. Namely, the periphery has a pair of first straight edge portions 24a, a pair of second straight edge portions 24b perpendicular to the first straight edge portions 24a, and curved portions 24c formed at corners between the adjacent straight edge portions 24a and 24b. The pair of first straight edge portions 24a are parallel to each other. The pair of second straight edge portions 24b are parallel to each other, and perpendicular to the first straight edge portions 24a.

Figure 2:
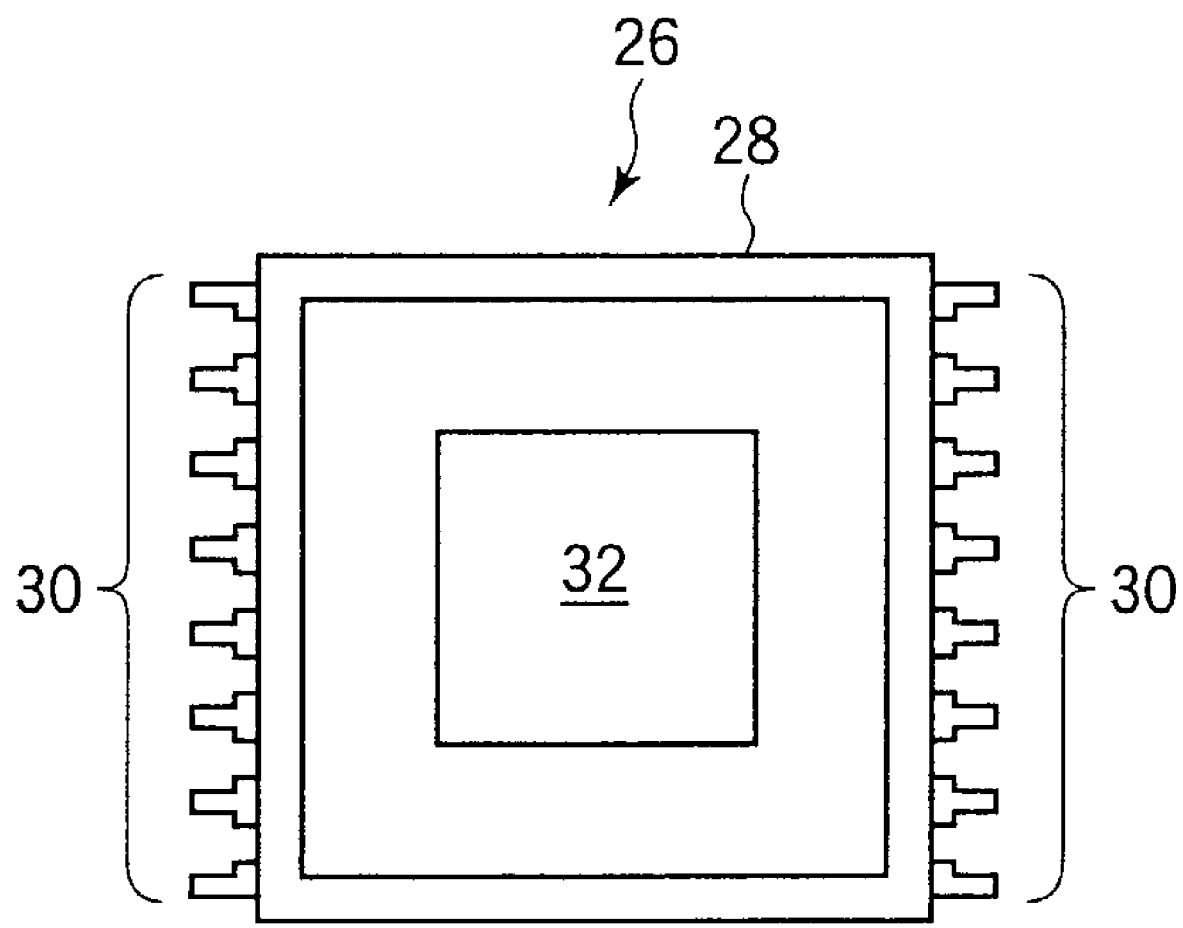
FIG. 2 is a plan view of a CCD which is to be fixed on the mounting plate.

FIG. 2 shows a commercially available CCD 26, which is the solid-state imaging device to be fixed on the mounting plate 10. The CCD 26 has a package body 28 and a plurality of lead lines 30 extending from opposite side walls of the package body 28. In FIG. 2, a front surface containing a light receiving area 32 is shown. Photodiodes are disposed on the light receiving area 32 and arranged in a matrix. When an image is formed, the image is photo-electrically converted to an electrical image signal through the photodiodes. Note that the light receiving area 32 is defined as an effective pixel area of the CCD, and as understood from FIG. 2, the light receiving area 32 is rectangular and formed on the front surface of the package body.

Figure 3:
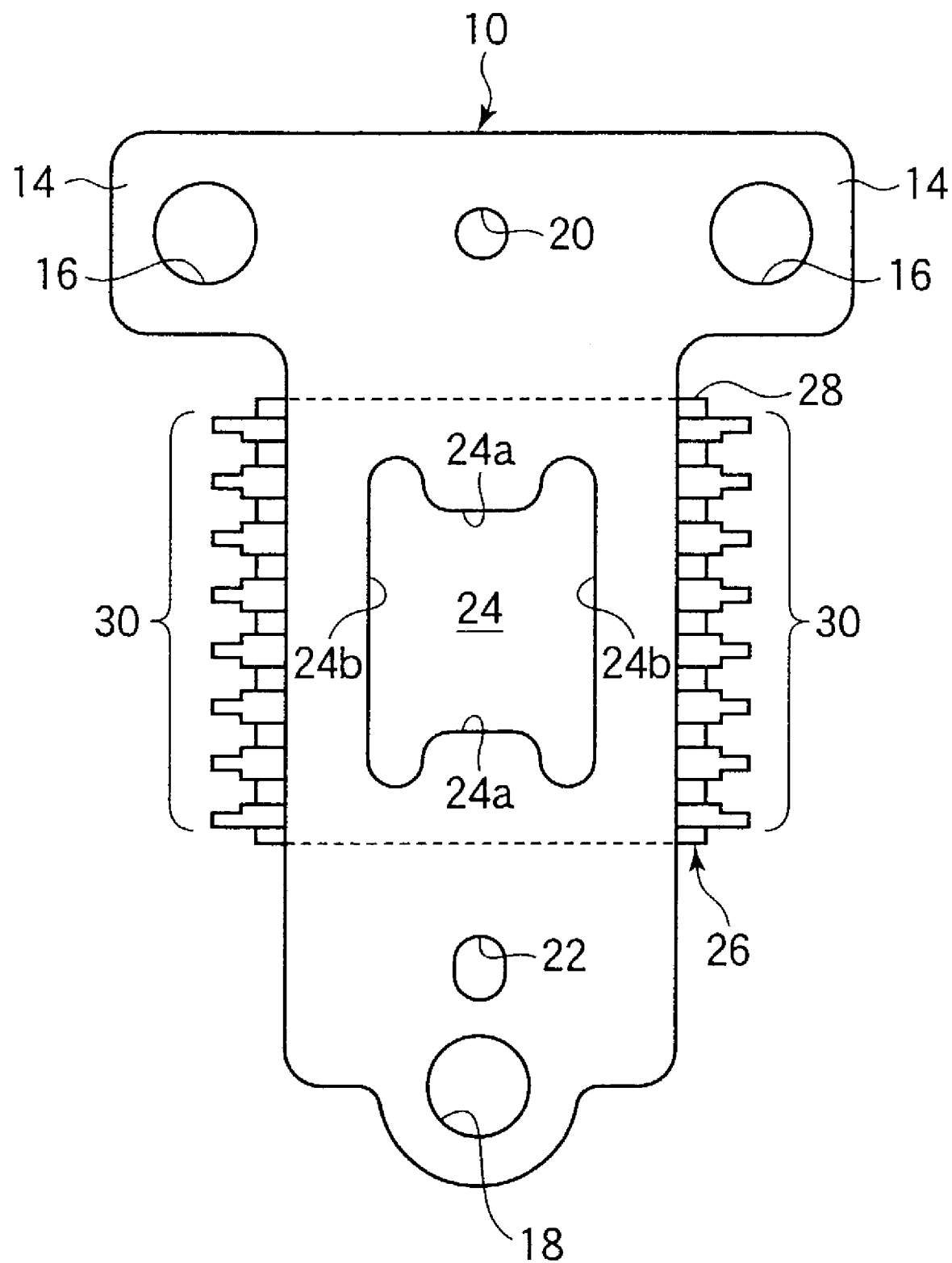
FIG. 3 is a plan view of the CCD shown in FIG. 2, which is placed on the mounting plate shown in FIG. 1, in such a manner that the rear surface of the CCD is attached to the mounting plate.

For bonding the CCD onto the mounting plate 10, first the CCD 26 is placed on the mounting plate 10 in such a manner that the rear surface of the CCD 26, which is opposite to the light receiving surface, closes the opening 24, as shown in FIG. 3. An adhesive agent such as a quick-drying adhesive agent or an ultraviolet-curing adhesive agent is then supplied to the periphery of the opening 24. Thus, the opening 24 forms an adhesive agent reservoir in association with the rear surface of the CCD 26. Namely, after the adhesive agent is supplied to the adhesive agent reservoir, and has set, the CCD 26 is completely attached to the mounting plate 10.

As described above, the attaching operation of the mounting plate 10 to an inner frame of the digital camera or video camera is duly carried out with the engagement of the positioning holes 20 and 22 and the positioning projections. Therefore, for properly positioning the light receiving area 32 of the CCD 26 with respect to the photographing optical system of the digital camera or video camera, the CCD 26 should be bonded to the mounting plate 10 at a proper position.

However, the position of-the light receiving area 32 relative to the package body 28 is not necessarily uniform even in products manufactured with the identical standards at the same production facility. Accordingly, the package body 28 cannot be used as the reference for the positioning of the light receiving area 32 relative to the mounting plate 10. Instead, the light receiving area 32 itself should be used as a reference to the mounting plate 10. Therefore, in the embodiment, at least two edge portions of the opening 24 of the mounting plate 10 are used for or function as, reference lines for positioning the light receiving area 32 of the CCD 26 over the opening 24.

Figure 4:
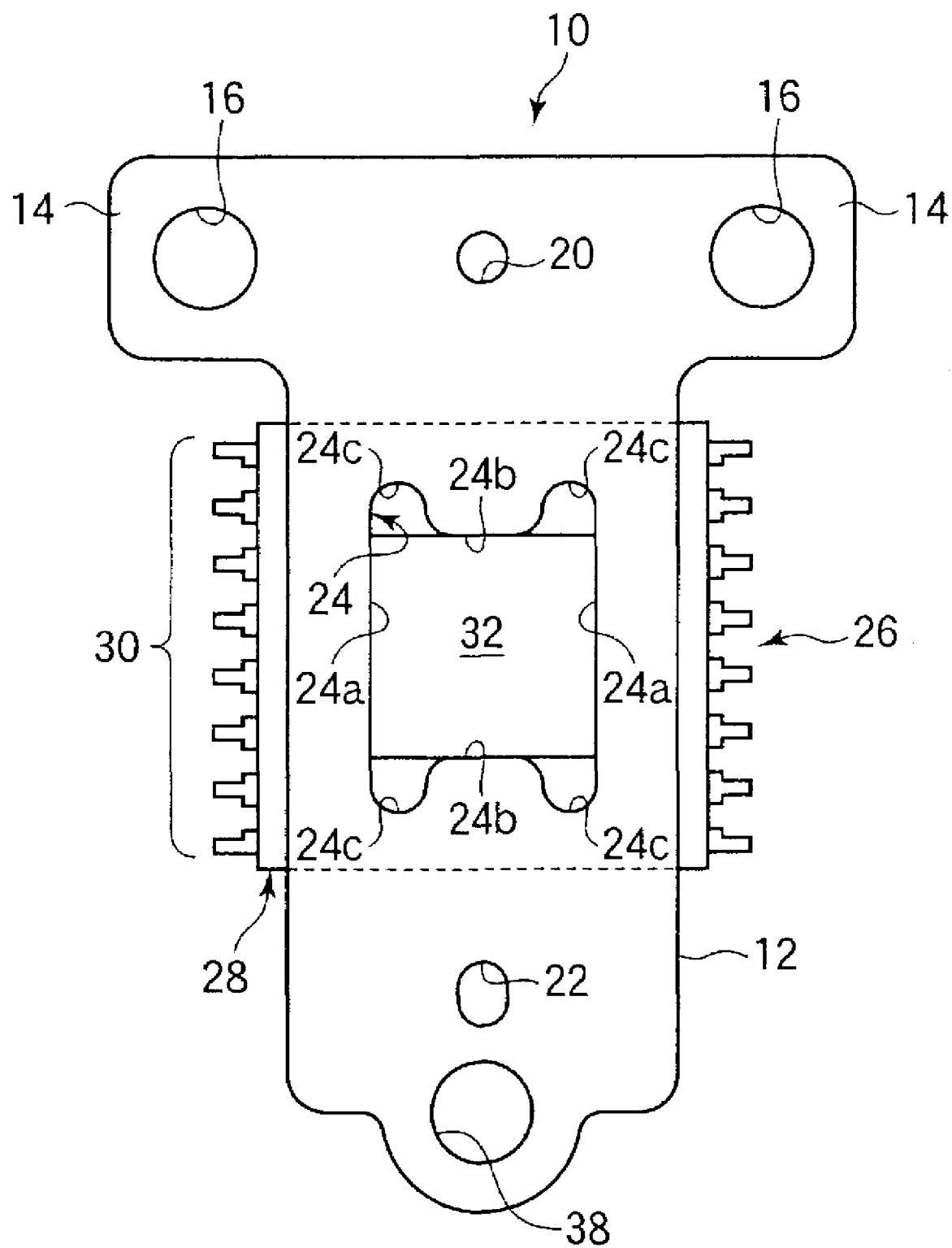
FIG. 4 is a plan view of the CCD, which is placed on the mounting plate shown in FIG. 1, in such a manner that the front surface of the CCD is attached to the mounting plate.

Namely, as shown in FIG. 4, the pair of first edge portions 24a and the pair of second edge portions 24b are extended along the contour of the light receiving area 32 of the CCD 26. Therefore, when the opening 24 is positioned relative to the light receiving area 32 in such a manner that the two pairs of edge portions 24a and 24b are aligned on the contour of the light receiving area 32 as shown in FIG. 4, the CCD 26 is positioned at the proper bonding position relative to the mounting plate 10. However, since the surface of the CCD 26 to be bonded to the mounting plate 10 is opposite to the light receiving surface, an adhesive agent cannot be supplied to the opening 24 of the mounting plate 10 in a state as shown in FIG. 4.

Therefore, in the embodiment, two mounting plates having the same structure are provided, and the CCD 26 is bonded or fixed to one of the mounting plates 10. Hereinafter, one mounting plate is referred to as the mounting plate 10, and the other mounting plate is referred to as the sub-mounting plate 10'. A bonding method is described below.

First, the CCD 26 is sandwiched between the two mounting plates 10, and the mounting plate 10 and the sub-mounting plate 10' are adjusted to align with each other.

Then, while keeping the adjusted condition of the mounting plate 10 and the sub-mounting plate 10', the light receiving area 32 of the CCD 26 is positioned over the opening 24 of the sub-mounting plate 10' in such a manner that the reference lines or the two pairs of edge portions 24a and 24b of the opening 24 of the sub-mounting plate 10', which is placed on the front surface of the CCD 26, are coincident with the contour of the light receiving area 24 of the sub-mounting plate 10'. Thus, the CCD 26 is positioned at the proper bonding position relative to the sub-mounting plate 10' which is placed on the front surface of the CCD 26.

Since the mounting plate 10 and the sub-mounting plate 10' are aligned with each other, when the CCD 26 is positioned at the proper bonding position relative to the sub-mounting plate 10' placed on the front surface, the CCD 26 is also positioned at the proper bonding position relative to the mounting plate 10 placed on the rear surface of the CCD 26.

Then, an adhesive agent is poured in the opening 24 of the mounting plate 10 placed on the rear surface of the CCD 26. The positional relationship between the CCD 26 and the mounting plate 10 attached to the rear surface of the CCD 26 is kept until the adhesive agent has dried. After the adhesive agent has dried, the sub-mounting plate 10' is removed from the front surface of the CCD 26, so that a state, in which the CCD 26 is bonded at the proper bonding position relative to the mounting plate 10, is obtained.

Figure 5:
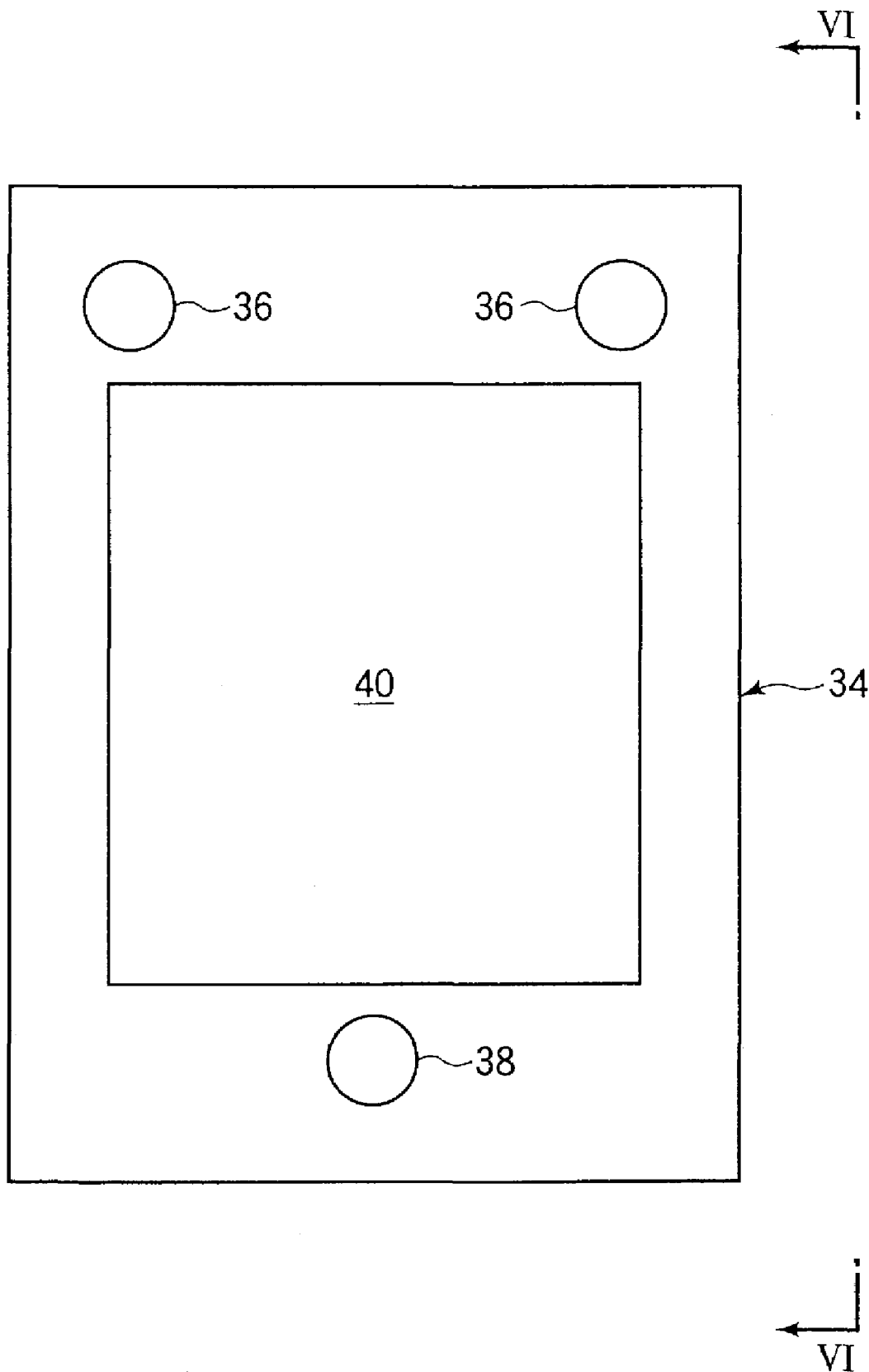
FIG. 5 is a plan view of a jig for bonding the CCD at a proper bonding position on the mounting plate.
Figure 6:
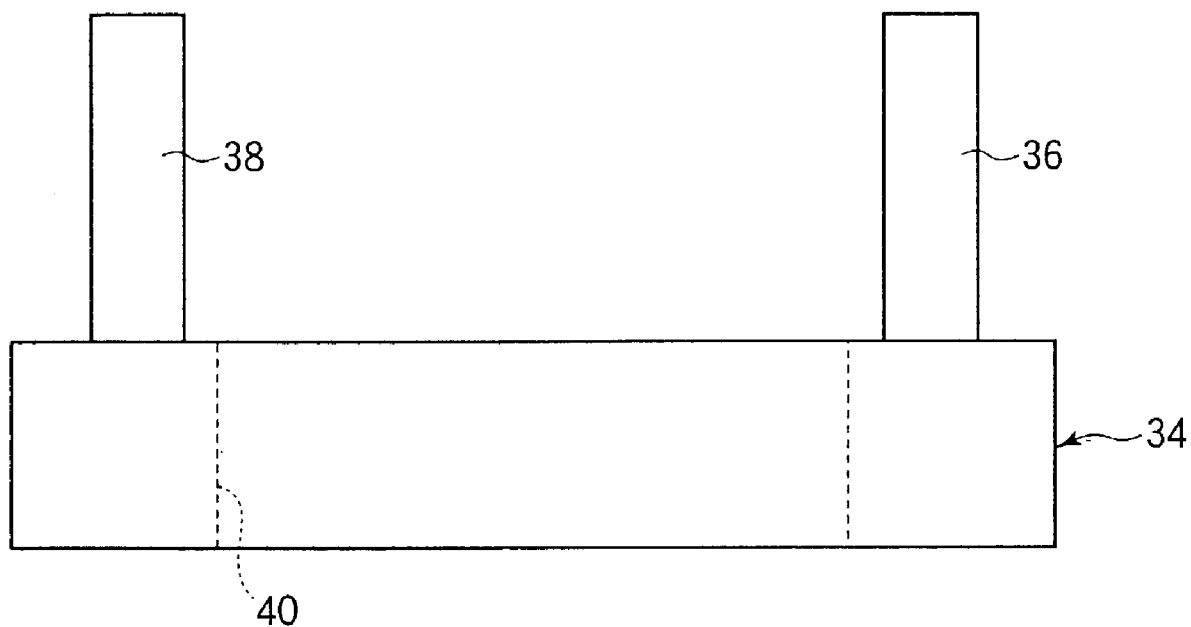
FIG. 6 is a front view of the jig, along line VI-VI of FIG. 5.

For performing the above described bonding method, the following jig shown in FIGS. 5 and 6 can be utilized. The jig has a rectangular body 34, a pair of guide poles 36 planted close to one side of the rectangular body 34, and a guide pole 38 planted in the center close to the opposite side of the rectangular body 34. A rectangular opening 40 is formed in the rectangular plate 34. The centers of the three guide poles 36 and 38 coincide with the vertexes of an isosceles triangle, which is identical with the isosceles triangle defined by the centers of the holes 16 and 18 formed in each of the mounting plate 10 and the sub-mounting plate 10'. The outer diameters of the pair of guide poles 36 substantially coincide with the inner diameters of the pair of through holes 16, and the outer diameter of the guide pole 38 substantially coincides with the inner diameter of the through hole 18. Namely, the difference between each of the through holes 16, 18 and each of the guide poles 36, 38 is very small.

Figure 7:
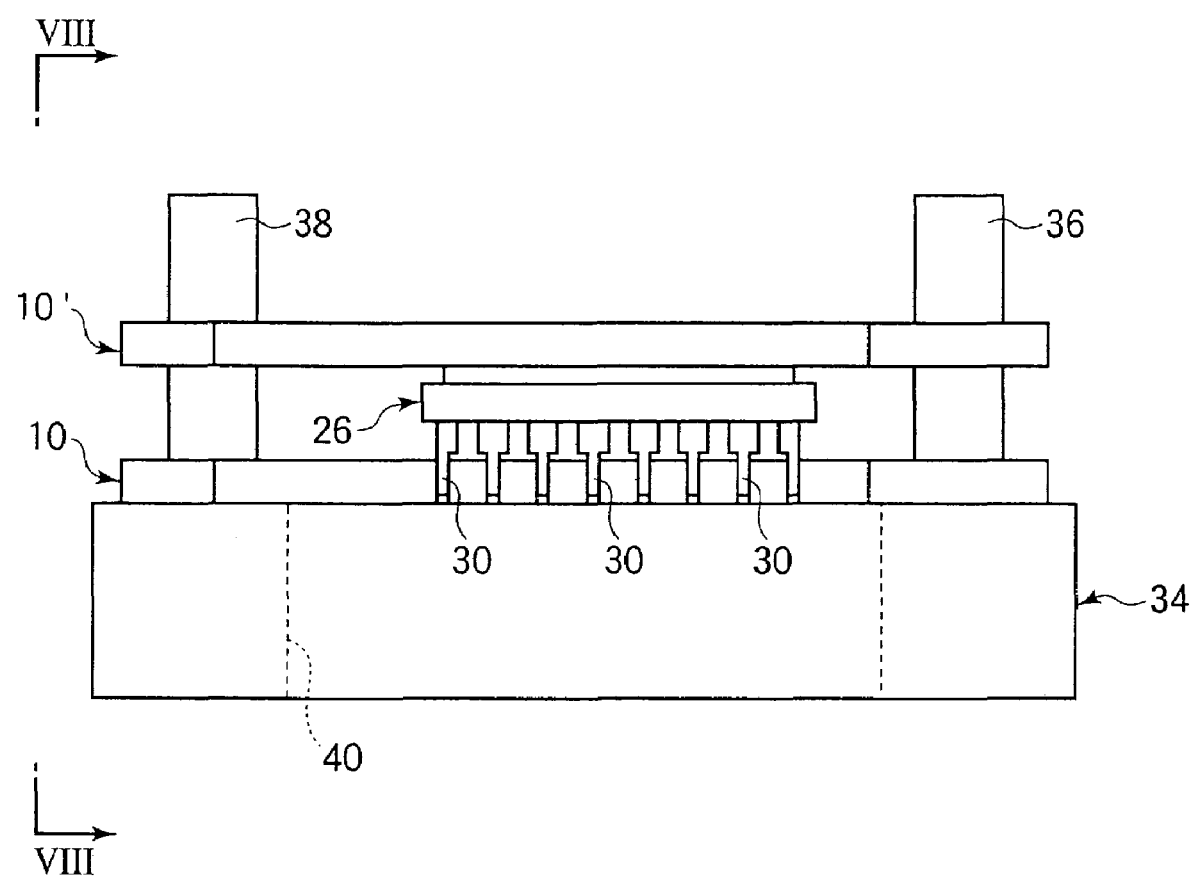
FIG. 7 is a front view showing a state in which the CCD is sandwiched between the two mounting plates which are attached to the jig.
Figure 8:
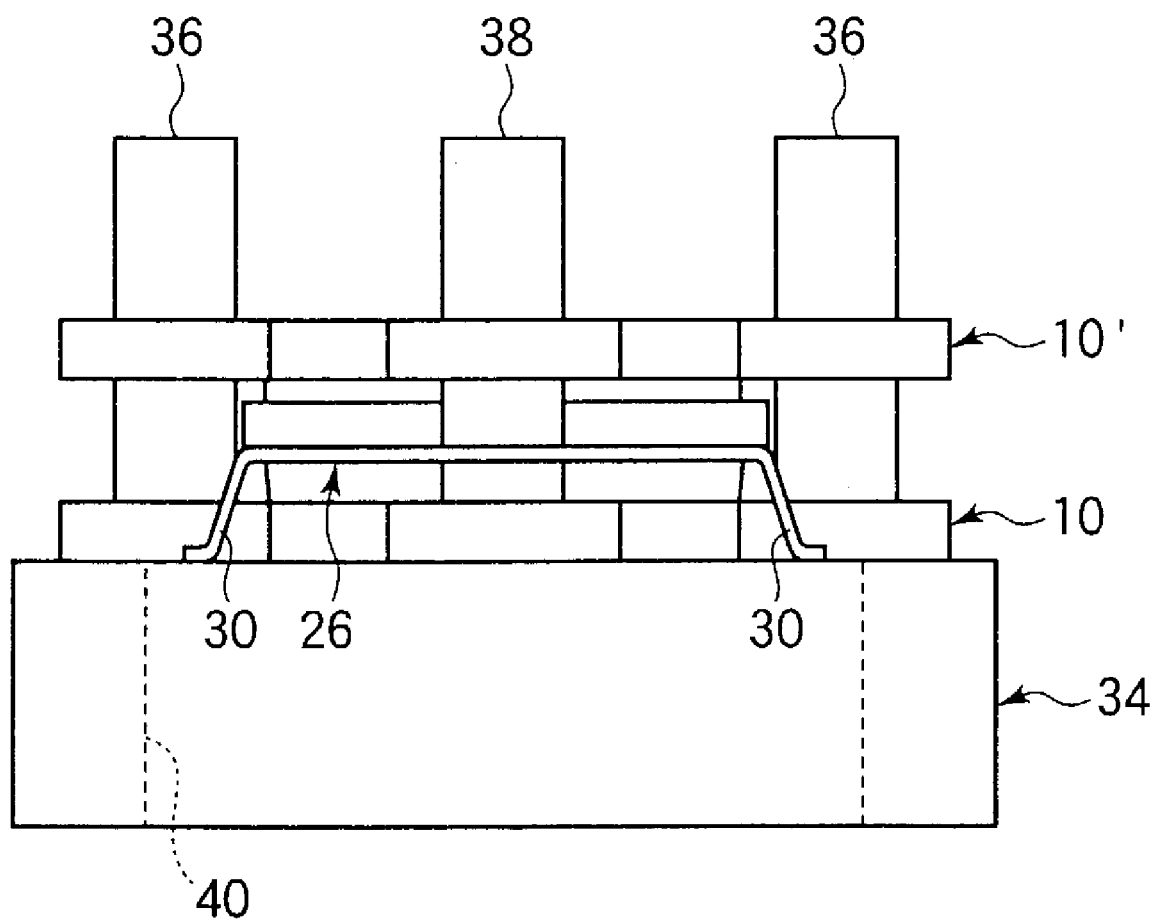
FIG. 8 is a side view along line VIII-VIII of FIG. 7.

As shown in FIGS. 7 and 8, when the mounting plate 10 and the sub-mounting plate 10' are mounted on the jig while the through holes 16 and 18 are fit on the guide poles 36 and 38, the mounting plate 10 and the sub-mounting plate 10' are aligned with each other. Note that, as described above, since the difference between each of the through holes 16, 18 and each of the guide poles 36, 38 is very small, if the mounting plate 10 or the sub-mounting plate 10' cannot be mounted on the jig as shown in FIGS. 7 and 8, the mounting plate 10 or the sub-mounting plate 10' is abandoned as a defective article.

Figure 9:
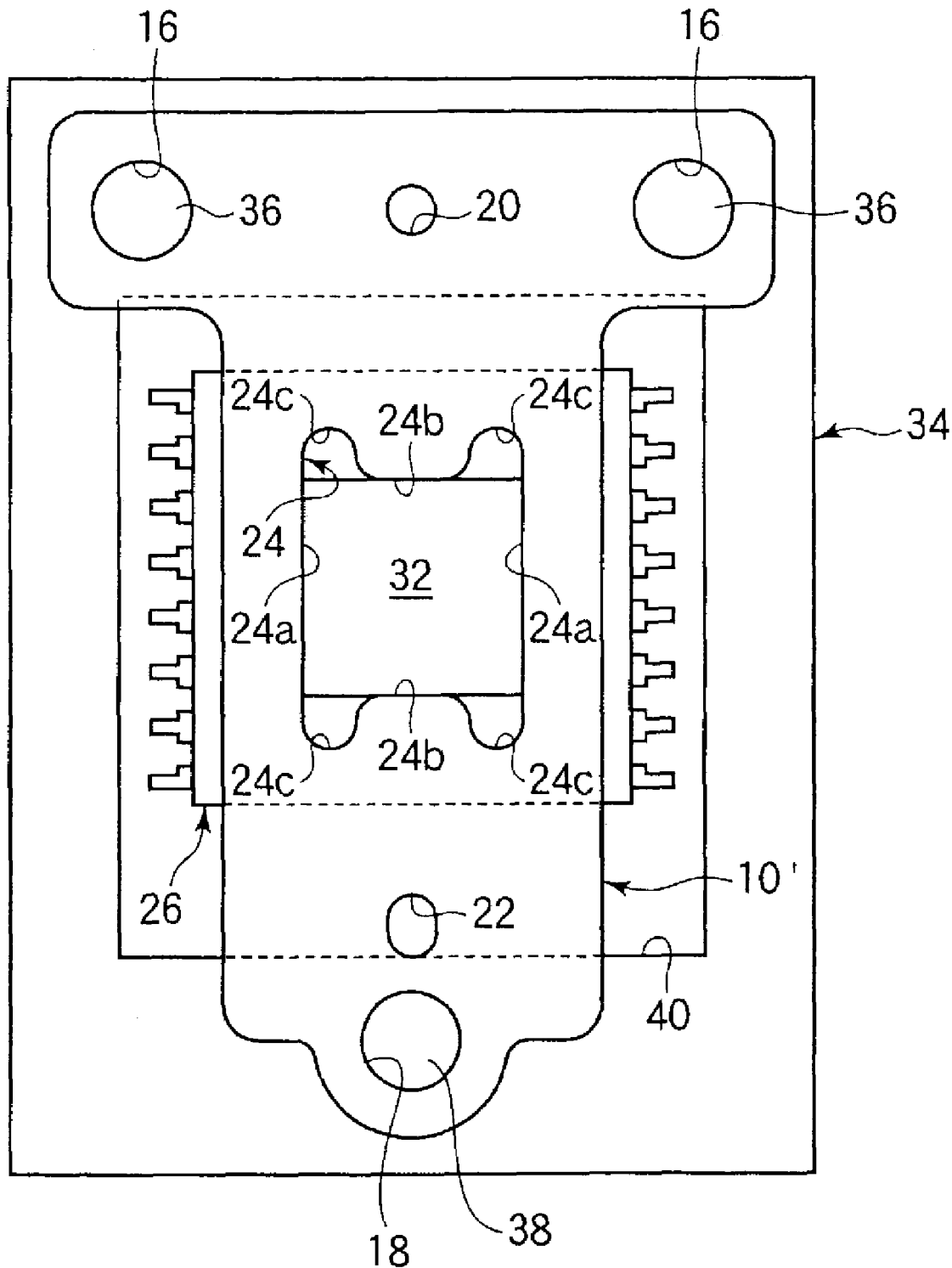
FIG. 9 is a plan view showing the state shown in FIG. 7.
Figure 10:
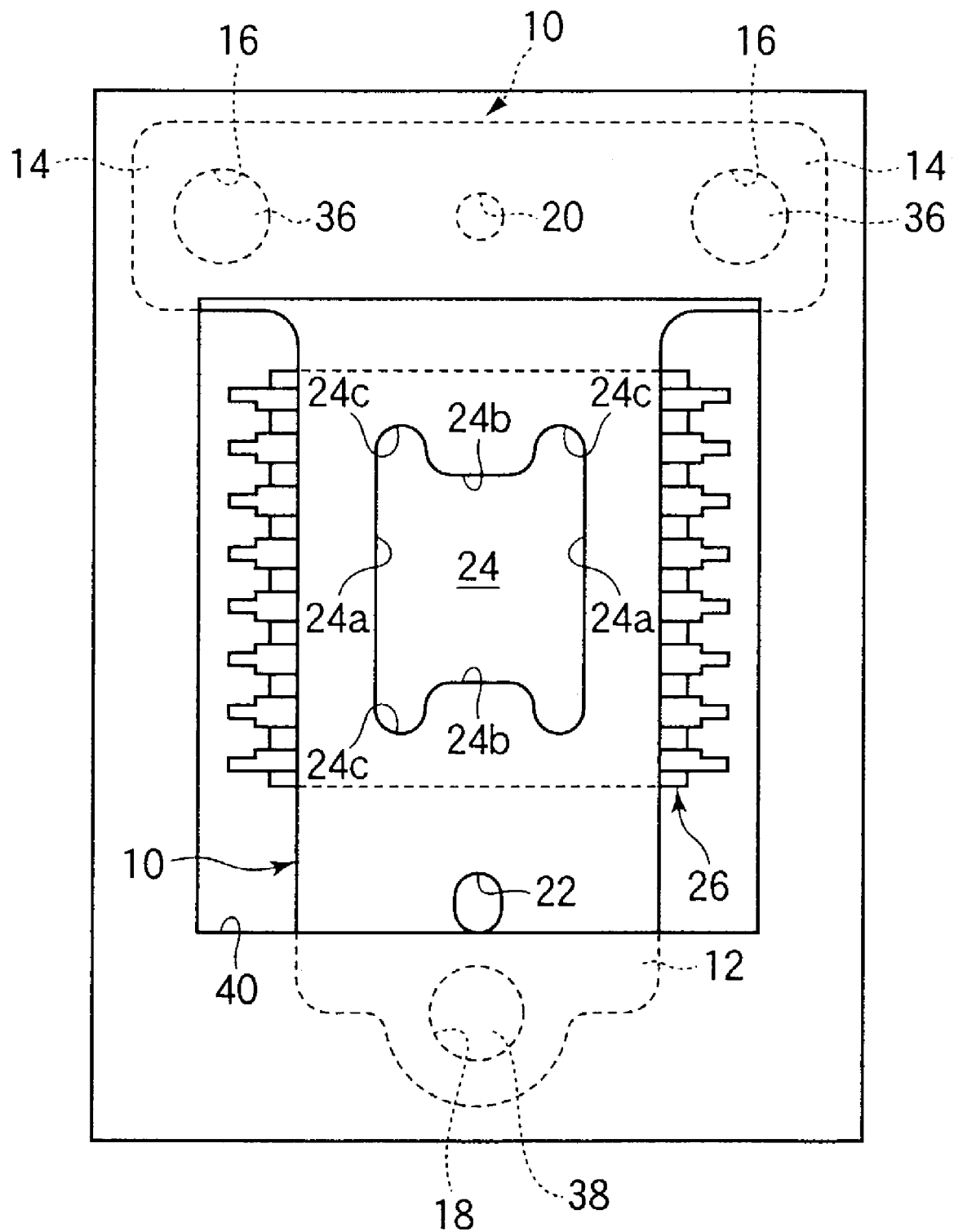
FIG. 10 is a bottom end view showing the state shown in FIG. 7.

The CCD 26 is sandwiched between the mounting plate 10 and the sub-mounting plate 10' which are aligned with each other, and under this condition, the front surface of the CCD 26 is placed on the sub-mounting plate 10', and the rear surface of the CCD 26 is placed on the mounting plate 10. Thus, when the CCD 26 is positioned at the proper bonding position relative to the sub-mounting plate 10' which is located at the upper side as shown in FIG. 9, the CCD 26 is also positioned at the proper bonding position relative to the mounting plate 10 which is located at the lower side as shown in FIG. 10.

When the positioning of the CCD 26 over the mounting plate 10 has been completed, the rectangular plate 34 of the jig and the upper or sub-mounting plate 10' are turned over by the operator while maintaining the sandwich condition, so that the bottom side of the jig faces upward. This state is shown in FIG. 9. In this state, an adhesive agent is supplied along the periphery of the opening 24 of the mounting plate 10, placed on the rear surface of the CCD 26, through the rectangular opening 40 of the rectangular plate 34, and thus, filled between the peripheral wall of the opening 24 and a portion of the rear surface of the CCD 26, close to the peripheral wall.

When a quick-drying adhesive agent is used as an adhesive agent, the operator keeps hold of the jig until the agent is dried. Conversely, when an ultraviolet-curing adhesive agent is used, ultraviolet light is irradiated onto the ultraviolet-curing adhesive agent while the operator holds the jig, so that the ultraviolet-curing adhesive agent dries. After the adhesive agent has dried, the upper or sub-mounting plate 10' is removed from the jig, and the lower or mounting plate 10, to which the CCD 26 is attached, is removed from the jig.

When the mounting plate 10, to which the CCD 26 is attached, is fixed on an inner frame housed in a digital camera or video camera, with a screw, the light receiving area 32 of the CCD 26 is properly positioned with respect to the photographing optical system.

The shape of the opening of the mounting plate 10 may be coincident with the rectangular contour of the light receiving area 32 of the CCD 26, and it is preferable that the curved portions 24c are formed at the corners of the periphery of the opening 24 as described above. This is because, by providing the curved portions 24c on the periphery of the opening 24, the amount of periphery of the mounting plate 10 bonded to the CCD 26 is increased. As a result, the bonding of the mounting plate 10 to the CCD 26 is strengthened.

Further, since the curved portions 24c, which are recessed or rounded at the corners, are provided, even if too much adhesive agent is supplied, the excessive adhesive agent flows into the curved portions 24c and is reserved there, so that excessive adhesive agent is prevented from protruding from the mounting plate 10 and the adhesive agent is uniformly distributed over the two pairs of edge portions 24a and 24b. Therefore, uniform and stable bonding occurs along the edge portions 24a and 24b.

Although, in the embodiment, the curved portions 24c are provided at the periphery of the opening 24 so as to increase the bonding periphery of the mounting plate 10 to the CCD 26, other constructions can be employed. For example, relatively small saw-toothed portions can be formed along a part of the periphery of the opening 24.

In the embodiment, for positioning the opening 24 relative to the rectangular light receiving area 32, reference lines extending along four edge portions 24a and 24b of the light receiving area 32 are provided. Conversely, the positioning of the opening 24 relative to the rectangular light receiving area 32 can be carried out by providing two reference lines extending along two edge portions of the light receiving area 32, which are perpendicular to each other.

According to the embodiment, a simplified attaching operation in which a mounting plate, to which a solid-state imaging device is bonded, is attached to an inner frame of a digital camera or video camera, is performed, so that the manufacturing cost of the digital camera or video camera is drastically reduced.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 2002-051096 (filed on Feb. 27, 2002) which is expressly incorporated herein, by reference, in its entirety.

The invention claimed is:

1. A mounting plate having an opening provided for adhesively bonding a solid-state imaging device to the mounting plate, said solid-state imaging device having a light receiving area, a size of the light receiving area being smaller than a size of the solid state imaging device, the mounting plate comprising:

a first edge portion that defines a first part of a periphery of said opening; and a second edge portion that defines a second part of the periphery of said opening; and a third edge portion that defines a third part of the periphery of said opening, said third edge portion configured to increase an adhesive bonding periphery of said mounting plate to said solid-state imaging device, a surface of said solid-state imaging device that is opposite to a light receiving surface of the solid-state imaging device being adhesively bonded to the mounting plate;

said first and second edge portions extending along and at least partially coinciding with a contour of said light receiving area to provide reference lines for positioning the light receiving area of said solid-state imaging device over said opening.

2. A mounting plate according to claim 1, wherein said first and second edge portions are straight, and said third edge portion is curved.

3. A mounting plate according to claim 1, wherein said first edge portion is perpendicular to said second edge portion.

4. The mounting plate according to claim 1, said plate having a generally T-shape configuration, and including a plurality of holes configured to be aligned with corresponding structure on a mounting portion of a camera, centers of the holes defining vertexes of an isosceles triangle.

5. The mounting plate according to claim 1, further comprising a plurality of positioning holes, at least one of the positioning holes defining an elongated shape said, positioning holes configured to received projections therein.

6. The mounting plate according to claim 1, said opening having a generally H-shape.

7. The mounting plate according to claim 1, said first and second edge portions configured to abut said contour of said light receiving area.

8. The mounting plate according to claim 1, the third edge portion defining an adhesive receiving region between the contour of the light receiving area and the third edge portion.

9. A mounting plate having an opening provided for adhesively bonding a solid-state imaging device to the mounting plate, said solid-state imaging device having a light receiving area, a size of the light receiving area being smaller than a size of the solid state imaging device and defining an effective pixel area of the solid state imaging device, said mounting plate comprising:

first edge portions that are straight and parallel to each other, to define first parts of the periphery of said opening; and second edge portions that are straight and parallel to each other, to define second parts of the periphery of said opening, said second edge portions being perpendicular to said first edge portions;

said first and second edge portions extending along and at least partially coinciding with a contour of said light receiving area to provide reference lines for positioning the light receiving area of said solid-state imaging device over said opening.

10. The mounting plate according to claim 9, further comprising third edge portions between said first edge portions and said second edge portions said third edge portions comprising curves.

11. The mounting plate according to claim 10, the third edge portion defining an adhesive receiving region between the contour of the light receiving area and the third edge portion.

12. The mounting plate according to claim 9, said plate having a generally T-shape configuration, and including a plurality of holes configured to be aligned with corresponding structure on a mounting portion of a camera, centers of the holes defining vertexes of an isosceles triangle.

13. The mounting plate according to claim 9, further comprising a plurality of positioning holes, at least one of the positioning holes having an elongated shape said positioning holes configured to received projections therein.

14. The mounting plate according to claim 9, said opening having a generally H-shape.

15. The mounting plate according to claim 9, said first and second edge portions configured to abut said contour of said light receiving area.

16. A method for adhesively bonding a solid-state imaging device, having a light receiving area, to a mounting plate that comprises a first edge portion and a second edge portion, a size of the light receiving area being smaller than a size of the solid state imaging device and defining an effective pixel are a of the solid-state imaging device, said first and second edge portions defining a periphery of an opening of the mounting plate, said first and second edge portions corresponding to a contour of said light receiving area so as to provide reference lines for positioning the light receiving area of said solid-state imaging device over said opening, said method comprising:

providing a sub-mounting plate having the same structure as a structure of said mounting plate;

sandwiching said solid-state imaging device between said mounting plate and said sub-mounting plate which are aligned with each other;

positioning said solid-state imaging device over the opening of the sub-mounting plate by adjusting a reference line of said sub-mounting plate to align with said contour of said light receiving area, while maintaining said mounting plate and said sub-mounting plate aligned with each other; and supplying adhesive to the periphery of said opening of said mounting plate, so that said solid-state imaging device, sandwiched between mounting plate and sub-mounting plate, is adhesively bonded to said mounting plate.

17. The method for bonding according to claim 16, further comprising removing the sub-mounting plate after supplying the adhesive.

18. The method for bonding according to claim 16, wherein the first and second edge portions at least partially coincide with a contour of the light receiving area.

19. The method for bonding according to claim 16, the first and second edge portions configured to abut the contour of the light receiving area.

20. The method for bonding according to claim 16, the positioning comprising bringing the first and second edge portions into contact with the contour of the light receiving area.

* * * * *